(12) United States Patent
Ramaswamy et al.

(10) Patent No.: US 9,805,789 B2
(45) Date of Patent: Oct. 31, 2017

(54) OXIDE BASED MEMORY

(71) Applicant: Micron Technology, Inc., Boise, ID (US)

(72) Inventors: D. V. Nirmal Ramaswamy, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 14/308,786

(22) Filed: Jun. 19, 2014

(65) Prior Publication Data

US 2014/0362634 A1    Dec. 11, 2014

Related U.S. Application Data

(62) Division of application No. 12/794,430, filed on Jun. 4, 2010, now Pat. No. 8,796,656.

(51) Int. Cl.
*H01L 29/22* (2006.01)
*H01L 21/36* (2006.01)
*G11C 13/00* (2006.01)
*H01L 45/00* (2006.01)
*H01L 27/24* (2006.01)

(52) U.S. Cl.
CPC ...... *G11C 13/0007* (2013.01); *H01L 27/2463* (2013.01); *H01L 45/08* (2013.01); *H01L 45/1233* (2013.01); *H01L 45/146* (2013.01); *H01L 45/1616* (2013.01); *G11C 2213/55* (2013.01); *G11C 2213/56* (2013.01)

(58) Field of Classification Search
CPC ..... H01L 29/22; H01L 21/36; H01L 27/2463; H01L 45/1233; H01L 45/146; H01L 45/1616; H01L 45/08; G11C 13/0007; G11C 2213/55; G11C 2213/56
USPC .......................................................... 438/104
See application file for complete search history.

(56) References Cited

U.S. PATENT DOCUMENTS

| 2003/0048666 A1* | 3/2003 | Eldridge ............... H01L 27/115 365/185.28 |
| 2004/0159828 A1 | 8/2004 | Rinerson et al. |
| 2006/0054937 A1 | 3/2006 | Lucovsky et al. |
| 2006/0171200 A1* | 8/2006 | Rinerson ............. G06F 17/5045 365/185.1 |
| 2007/0105390 A1 | 5/2007 | Oh |
| 2008/0211036 A1 | 9/2008 | Zhao et al. |

(Continued)

OTHER PUBLICATIONS

International Search Report and Written Opinion for related PCT Application No. PCT/US2011/000971 mailed Feb. 8, 2012 (9 pp.).

(Continued)

*Primary Examiner* — Asok K Sarkar
*Assistant Examiner* — Dmitriy Yemelyanov
(74) *Attorney, Agent, or Firm* — Brooks, Cameron & Huebsch, PLLC

(57) ABSTRACT

Methods, devices, and systems associated with oxide based memory are described herein. In one or more embodiments, a method of forming an oxide based memory cell includes forming a first electrode, forming a tunnel barrier, wherein a first portion of the tunnel barrier includes a first material and a second portion of the tunnel barrier includes a second material, forming an oxygen source, and forming a second electrode.

12 Claims, 5 Drawing Sheets

(56) References Cited

U.S. PATENT DOCUMENTS

| | | |
|---|---|---|
| 2009/0026434 A1* | 1/2009 | Malhotra ................ H01L 45/08 257/2 |
| 2009/0026441 A1 | 1/2009 | Cheung et al. |
| 2009/0225582 A1 | 9/2009 | Schloss |
| 2009/0231906 A1 | 9/2009 | Rinerson et al. |
| 2010/0019219 A1 | 1/2010 | Lee |
| 2010/0155722 A1* | 6/2010 | Meyer .................... H01L 45/12 257/43 |
| 2011/0149634 A1 | 6/2011 | Schloss et al. |

OTHER PUBLICATIONS

Taiwan office action for related Taiwanese Application No. 100119675, dated Aug. 7, 2013, 14 pp.

* cited by examiner

| | 20nm CELL @ 0.5V | | |
|---|---|---|---|
| | *720* Qox/cm2 | *730* HfOx or ZrOx | *740* AlOx-HfOx |
| *722* | -6.50E+13 | 1.3nA | 0.87nA |
| *726* | 0 | 4.2nA | 3.23nA |
| *724* | 6.5E+13 | 15nA | 14.4nA |
| *728* | Ion/Ioff | 11.5nA | 16.6nA |

US 9,805,789 B2

OXIDE BASED MEMORY

PRIORITY INFORMATION

This application is a Divisional of U.S. application Ser. No. 12/794,430, filed Jun. 4, 2010, which is incorporated by reference.

TECHNICAL FIELD

The present disclosure relates generally to semiconductor memory devices and methods, and more particularly, to oxide based memory devices and methods.

BACKGROUND

Oxide based memory devices can be used in a number of electrical systems and can include two electrodes with a tunnel barrier and an oxygen source between the two electrodes. Oxide based memory devices can operate by applying a positive voltage across the electrodes of the memory device to cause oxygen ions from the oxygen source to move to the tunnel barrier. A negative voltage can be applied across the electrodes of the memory device to cause oxygen ions to move from the tunnel barrier to the oxygen source. The resistivity of the memory device is dependent on the oxygen ion location and changes as the location of the oxygen ions changes, either in the tunnel barrier, in the oxygen source and/or in a portion of each. Therefore, the state of the memory device can change depending on the location of the oxygen ions and the state of the device can be read by applying a read voltage across the electrodes of the memory device.

In oxide based memory devices, the retention of the oxygen ions in the tunnel barrier and/or oxygen source can determine the ability of the memory device to maintain a state. For memory devices that better retain oxygen ions in the tunnel barrier it can also be more difficult to move the oxygen ions to the tunnel barrier, e.g., more current is required. And memory devices that can more easily move oxygen ions to the tunnel barrier, e.g., less current is required, may not satisfactorily retain the oxygen ions in the tunnel barrier. A memory device that exhibits poor retention of the oxygen ions in the tunnel barrier may not be reliable in maintaining an "on" state or an "off" state for the memory device. An oxide based memory device that can move oxygen ions between the oxygen source and the tunnel barrier and retain the oxygen ions in the tunnel barrier may have greater reliability in maintaining an "on" state or an "off" state.

DETAILED DESCRIPTION

Figure 1:
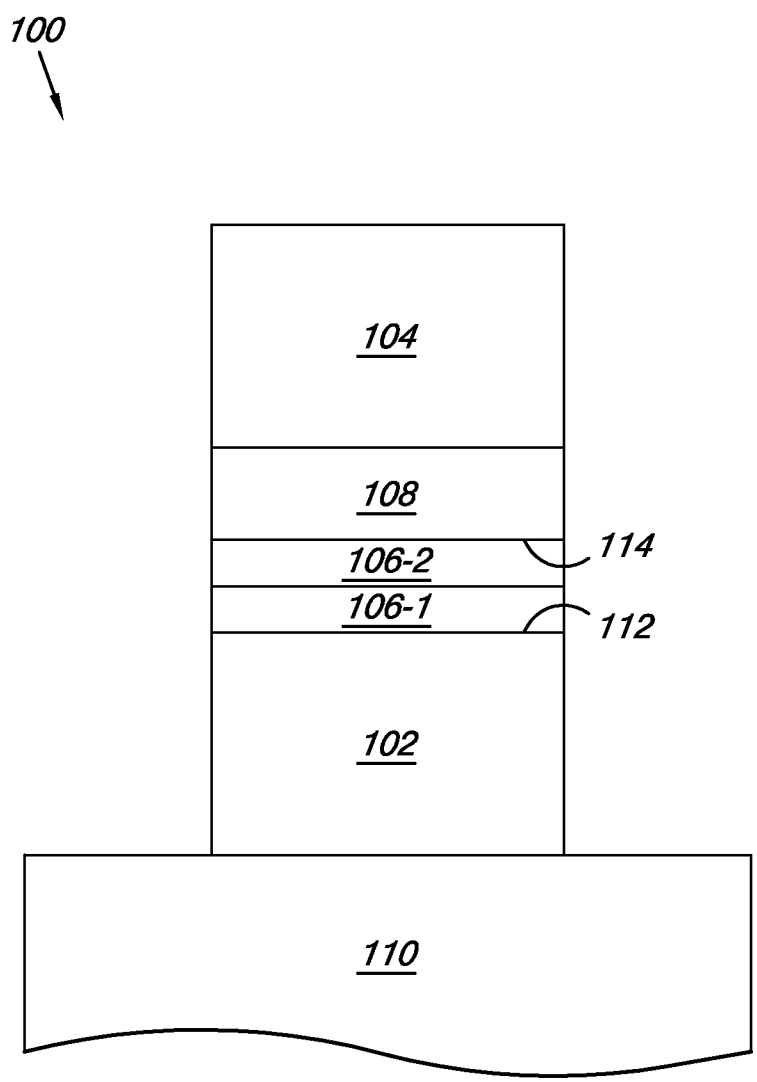
FIG. 1 illustrates a cross-sectional view of a portion of an oxide based memory cell formed in accordance with one or more embodiments of the present disclosure.

Methods, devices, and systems associated with oxide based memory are described herein. In one or more embodiments, a method of forming an oxide based memory cell includes forming a first electrode, forming a tunnel barrier, wherein a first portion of the tunnel barrier includes a first material and a second portion of the tunnel barrier includes a second material, forming an oxygen source, and forming a second electrode.

One or more embodiments of the present disclosure can provide benefits such as reducing the current used for a write operation and the current used for an erase operation. For instance, one or more embodiments can provide the ability to control the current used, and thus voltage, to move oxygen ions to a tunnel barrier, to retain the oxygen ions in the tunnel barrier, and to control the current used, and thus voltage, to move the oxygen ions from the tunnel barrier to the oxygen source. The ability to move oxygen ions to and/or retain oxygen ions in the tunnel barrier in a programmed state can help provide a stable and reliable memory device.

Embodiments of the present disclosure will now be described in detail with reference to the accompanying figures. It should be noted that although the figures illustrate only one memory cell, the semiconductor structures contemplated herein can have more than one memory cell.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates a cross-sectional view of a portion of an oxide based memory cell formed in accordance with one or more embodiments of the present disclosure. The cell 100 includes a bottom electrode 102 formed over a substrate 110. The substrate 110 can be a silicon substrate or SOI substrate, among others.

In one or more embodiments, the bottom electrode 102 can be any suitable metal, such as platinum (Pt), among other metals. The bottom electrode can be formed by deposition processes such as, but not limited to, chemical vapor deposition (CVD) and plasma vapor deposition (PVD), etc. The bottom electrode can be coupled to circuitry that can provide current to the memory cell for programming, erasing, and/or reading the memory cell.

In one or more embodiments, tunnel barrier 106 can be formed over the bottom electrode 102. A first portion of the tunnel barrier 106-1 can include a first material starting a first edge 112 of the tunnel barrier 106 and a second portion of the tunnel barrier 106-2 can include a second material ending at a second edge 114 of the tunnel barrier 106. In one or more embodiments, the first material can be aluminum oxide ($AlO_x$), silicon dioxide ($SiO_2$), silicon oxynitride (SiON), hafnium silicon oxide ($HfSiO_x$), hafnium silicon nitride (HfSiN), zirconium silicon oxide ($ZrSiO_x$), or zirconium silicon oxynitride (ZrSiON), among other materials, and the second material can be hafnium oxide ($HfO_x$), zirconium oxide ($ZrO_x$), titanium oxide ($TiO_2$), hafnium zirconium oxide ($HfZrO_x$), hafnium titanium oxide ($HfTiO_x$), zirconium titanium oxide ($ZrTiO_x$), or strontium oxide (SrO), among other materials. The first material and the second material can be formed using atomic layer deposition (ALD), chemical vapor deposition (CVD), and/or sputtering, among other suitable formation techniques.

In one or more embodiments, oxygen source 108 can be formed over the tunnel barrier 106. The oxygen source 108 can be formed of perovskite metal oxide (PCMO), titanium oxide ($TiO_x$), and/or magnesium oxide (MgO), among other suitable oxygen sources. The oxygen source 108 can provide the source of the oxygen ions that move from the oxygen source 108 to the tunnel barrier 106 when a biasing voltage is applied to the memory cell 100 that is sufficient to cause the oxygen ions to move from the oxygen source 108 to the tunnel barrier 106. The oxygen source can have a thickness of approximately 20-2000 angstroms (Å).

As discussed herein, the tunnel barrier 106 of the present disclosure can form an oxygen ion trapping area of a memory cell 100. In some embodiments, the tunnel barrier 106 can have a size in the range of approximately two (2) to one hundred (100) nanometer (nm) in thickness.

The cell 100 includes a top electrode 104 formed over oxygen source 108. In one or more embodiments, the top electrode 104 can be any suitable metal, such as platinum (Pt), among other metals. The top electrode can be formed by deposition processes such as, but not limited to, chemical vapor deposition (CVD) and/or plasma vapor deposition (PVD), etc. The top electrode can be coupled to circuitry that can provide current to the memory cell for programming, erasing, and/or reading the memory cell.

In one or more embodiments, the tunnel barrier 106 can be formed from a first material and a second material. The first portion of the tunnel barrier 106-1, which includes the first material, can provide an activation energy for oxygen ion diffusion that is higher than the second material's activation energy for oxygen ion diffusion and is more likely to retain oxygen ions that enter the first material once the biasing voltage is no longer applied to the memory cell. The second portion of the tunnel barrier 106-2, which includes the second material, can provide an activation energy for oxygen ion diffusion that is lower than first material's activation energy for oxygen ion diffusion and allows the oxygen ions to move from the oxygen source 108 to and through the second portion of tunnel barrier 106-2 at a lower biasing voltage than the first portion of the tunnel barrier 106-1, which includes the first material. The combination of the first material and the second material in the tunnel barrier provide for the combined properties of ease of transfer of the oxygen ions to the tunnel barrier and retention of the oxygen ions in the tunnel barrier.

The memory cell 100 can use the tunnel barrier 106 and the oxygen source 108 as part of a multi-resistive memory cell. Accordingly, memory devices of an embodiment of the present disclosure are suitable as a non-volatile memory and can be scaled for future technologies. The memory devices can be used in a memory array that uses cross point architecture, for example, among other suitable architectures. A memory device according to the present disclosure can change resistance more easily and be more reliable in maintaining a resistive state.

Figure 2:
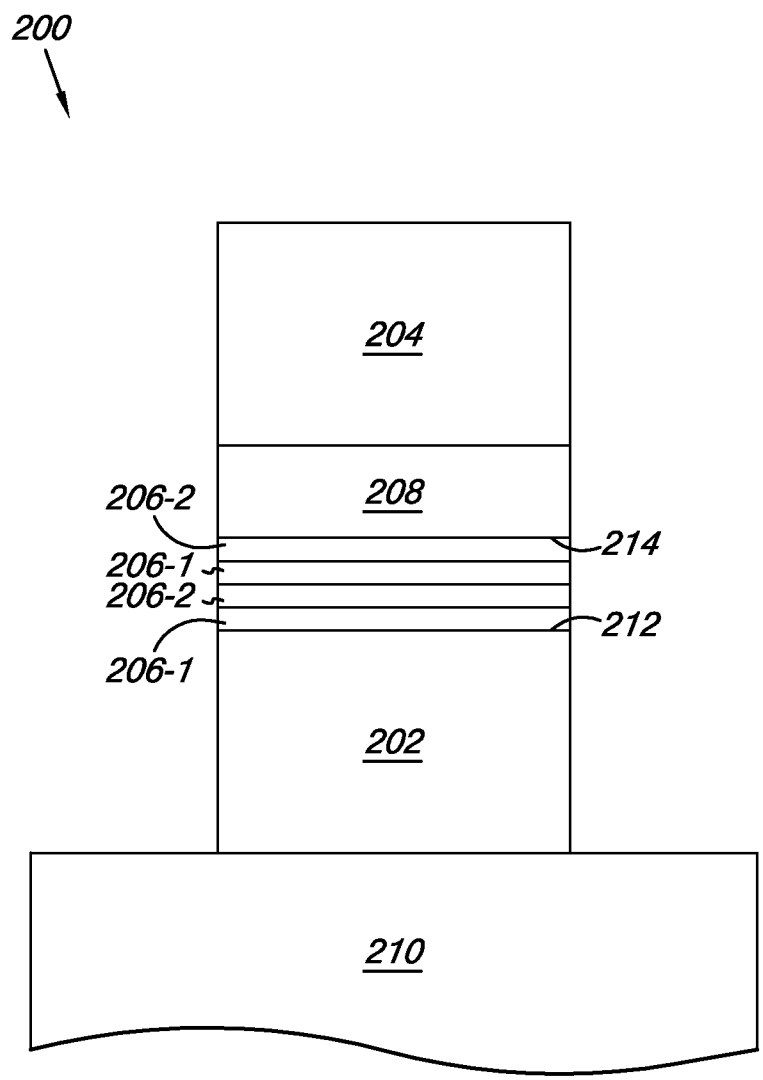
FIG. 2 illustrates a cross-sectional view of a portion of an oxide based memory cell formed in accordance with one or more embodiments of the present disclosure.

FIG. 2 illustrates a cross-sectional view of a portion of an oxide based memory cell formed in accordance with one or more embodiments of the present disclosure. The cell 200 includes a bottom electrode 202 formed over a substrate 210, such as described above in association with FIG. 1.

In one or more embodiments, tunnel barrier 206 can be formed over the bottom electrode 202. In one or more embodiments, a first portion of the tunnel barrier 206-1 can include a first material, a second portion of the tunnel barrier 206-2 can include a second material, a third portion of the tunnel barrier 206-3 can include a third material, and a fourth portion of the tunnel barrier 206-4 can include a fourth material. In various embodiments, the thickness of each portion of the tunnel barrier can vary. In one or more embodiments, the first and third materials can be aluminum oxide ($AlO_x$), silicon dioxide ($SiO_2$), silicon oxynitride (SiON), hafnium silicon oxide ($HfSiO_x$), hafnium silicon nitride (HfSiN), zirconium silicon oxide ($ZrSiO_x$), or zirconium silicon oxynitride (ZrSiON), among other materials, and the second and fourth materials can be hafnium oxide ($HfO_x$), zirconium oxide ($ZrO_x$), titanium oxide ($TiO_2$), hafnium zirconium oxide ($HfZrO_x$), hafnium titanium oxide ($HfTiO_x$), zirconium titanium oxide ($ZrTiO_x$), or strontium oxide (SrO), among other materials. In various embodiments, the tunnel barrier can include any number of portions which alternate between the first or third materials and the second or fourth materials. Other combinations can be provided in various embodiments of the present disclosure. The thickness and proportions of the materials forming the tunnel barrier 206 can be modified to have desired operating characteristics, such as a desired programming and/or erase current. The first, second, third, and fourth materials can be formed using atomic layer deposition (ALD), chemical vapor deposition (CVD), and/or sputtering, among other suitable formation techniques.

In one or more embodiments, oxygen source 208 can be formed over the tunnel barrier 206. The oxygen source 208 can be formed of perovskite metal oxide (PCMO), titanium oxide ($TiO_x$), and/or magnesium oxide (MgO), among other suitable oxygen sources. The oxygen source 208 can provide the source of the oxygen ions that move from the oxygen source 208 to the tunnel barrier 206 when a biasing voltage is applied to the memory cell 200 that is sufficient to cause the oxygen ions to move from the oxygen source 208 to the tunnel barrier 206.

The cell 200 includes a top electrode 204 formed over oxygen source 208, such as described above in association with FIG. 1. The top electrode can be coupled to circuitry that can provide current to the memory cell for programming, erasing, and/or reading the memory cell.

Figure 3:
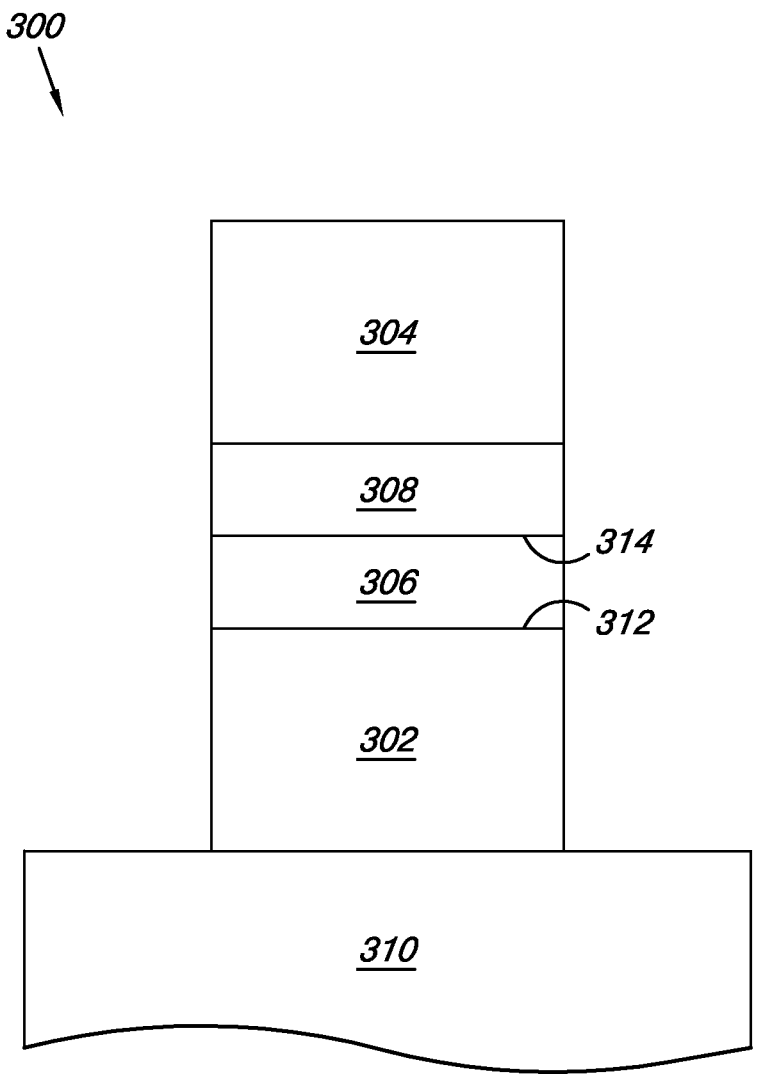
FIG. 3 illustrates a cross-sectional view of a portion of an oxide based memory cell formed in accordance with one or more embodiments of the present disclosure.

FIG. 3 illustrates a cross-sectional view of a portion of an oxide based memory cell formed in accordance with one or more embodiments of the present disclosure. The cell 300 includes a bottom electrode 302 formed over a substrate 310, such as described above in association with FIG. 1.

In one or more embodiments, tunnel barrier 306 can be formed over the bottom electrode 302. The tunnel barrier 306 can include a number of materials, such as a first material that can be aluminum oxide ($AlO_x$), silicon dioxide ($SiO_2$), silicon oxynitride (SiON), hafnium silicon oxide ($HfSiO_x$), hafnium silicon nitride (HfSiN), zirconium silicon oxide ($ZrSiO_x$), or zirconium silicon oxynitride ($ZrSiON$), among other materials, and a second material that can be hafnium oxide ($HfO_x$), zirconium oxide ($ZrO_x$), titanium oxide ($TiO_2$), hafnium zirconium oxide ($HfZrO_x$), hafnium titanium oxide ($HfTiO_x$), zirconium titanium oxide ($ZrTiO_x$), or strontium oxide (SrO), among other materials. In some embodiments, the tunnel barrier 306 can be a graded tunnel barrier including a first material and a second material. The proportion of the first material and the second material can start at 100% of the first material at a first edge 312 of the tunnel barrier. The proportion of the second material increases throughout the tunnel barrier until the tunnel barrier is 100% of the second material at a second edge 314 of the tunnel barrier. The second material can be introduced by diffusing the second material into the first material to create the graded tunnel barrier. The first material and the second material can be formed using atomic layer deposition (ALD), chemical vapor deposition (CVD), and/or sputtering, among other suitable formation techniques.

In one or more embodiments, oxygen source 308 can be formed over the tunnel barrier 306. The oxygen source 308 can be formed of perovskite metal oxide (PCMO), titanium oxide ($TiO_x$), and/or magnesium oxide (MgO), among other suitable oxygen sources. The oxygen source 308 can provide the source of the oxygen ions that move from the oxygen source 308 to the tunnel barrier 306 when a biasing voltage is applied to the memory cell 300 that is sufficient to cause the oxygen ions to move from the oxygen source 308 to the tunnel barrier 306.

The cell 300 includes a top electrode 304 formed over oxygen source 308, such as described above in association with FIG. 1. The top electrode can be coupled to circuitry that can provide current to the memory cell for programming, erasing, and/or reading the memory cell.

In one or more embodiments, the combination of the first material and the second material in the tunnel barrier provide for the combined properties of ease of transfer of the oxygen ions to the tunnel barrier and retention of the oxygen ions in the tunnel barrier. The proportions of the oxides forming the tunnel barrier can be modified to have desired operating characteristics, such as a desired programming or erase current.

Figure 4:
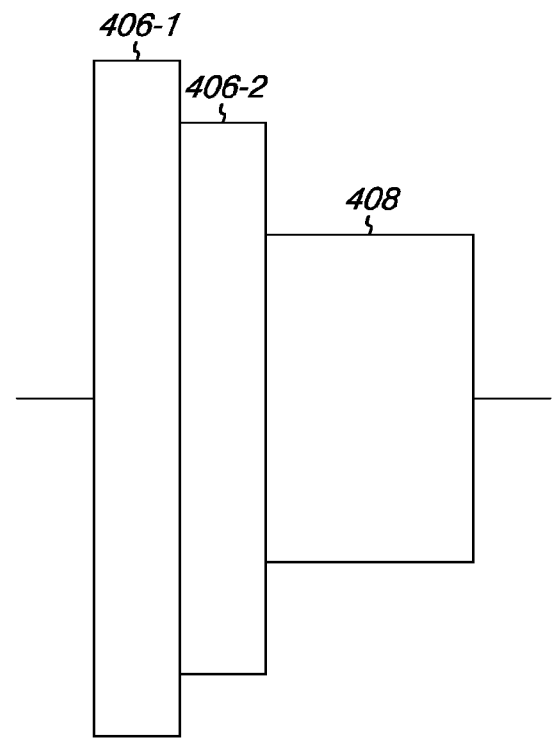
FIG. 4 is a graphical illustration of the energy band diagram for an oxide based memory cell formed in accordance with one or more embodiments of the present disclosure.

FIG. 4 is a graphical illustration of the energy band diagram for an oxide based memory cell formed in accordance with one or more embodiments of the present disclosure. FIG. 4 illustrates the energy band diagram for the tunnel barrier configuration shown in FIG. 1. The greater the activation energy for oxygen ion diffusion, the more likely a portion of the tunnel barrier is to retain oxygen ions once oxygen ions move to that portion of the tunnel barrier. In FIG. 4, oxygen ions can move more easily to the second portion 406-2 of the tunnel barrier than to the first portion 406-1 of the tunnel barrier, but are less likely to be retained in the second portion 406-2 of the tunnel barrier after the biasing voltage is removed.

In one or more embodiments, the first portion 406-1 of the tunnel barrier that includes the first material, such as aluminum oxide, has an activation energy for oxygen ion diffusion of approximately 5 electron volts (eV) and the second portion 406-2 of the tunnel barrier that includes the second material, such as hafnium oxide, has an activation energy for oxygen ion diffusion of approximately 2.5 eV. The differences in the activation energies of the first portion 406-1 and the second portion 406-2 of the tunnel barrier can affect the biasing voltage used to move oxygen ions to the tunnel barrier and can also affect the ability of the tunnel barrier to retain the oxygen ions after the biasing voltage is removed from the memory cell.

Figure 5:
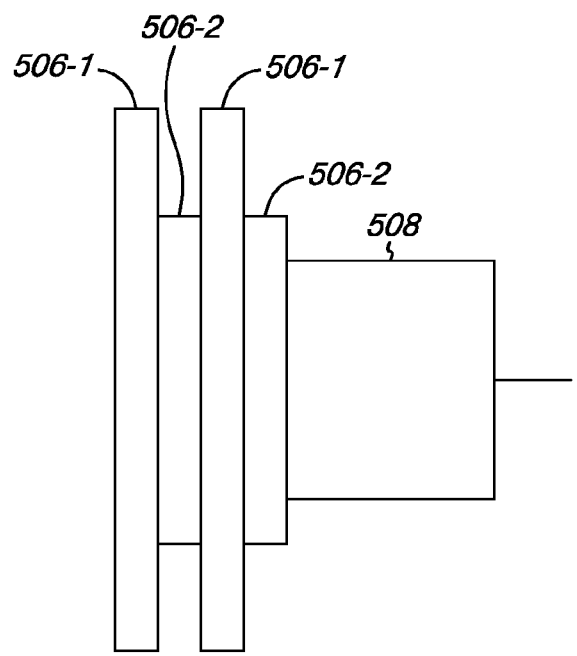
FIG. 5 is a graphical illustration of the energy band diagram for an oxide based memory cell formed in accordance with one or more embodiments of the present disclosure.

FIG. 5 is a graphical illustration of the energy band diagram for an oxide based memory cell formed in accordance with one or more embodiments of the present disclosure. FIG. 5 illustrates the energy band diagram for the tunnel barrier configuration shown in FIG. 2. The difference in the activation energies indicates that a greater biasing voltage is required to move oxygen ions from the oxygen source 508 through the first and third portions 506-1, 506-3 of the tunnel barrier than is required to move the oxygen ions from the oxygen source 508 through the second and fourth portions 506-2, 506-4 of the tunnel barrier. In FIG. 5, oxygen ions can move more easily to the second and fourth portions 506-2, 506-4 of the tunnel barrier than to the first and third portions 506-1, 506-3 of the tunnel barrier, but are less likely to be retained in the second and fourth portions 506-2, 506-4 after the biasing voltage is removed.

The differences between the activation energies of the first and third portions 506-1, 506-3 and the second and fourth portions 506-2, 506-4 of the tunnel barrier can affect the biasing voltage used to move oxygen ions to the tunnel barrier and can also affect the ability of the tunnel barrier to retain the oxygen ions after the biasing voltage is removed from the memory cell.

The energy band diagram of FIG. 5 for the tunnel barrier configuration shown in FIG. 2 includes alternating portions of a first material and a second material, where the second material has an activation energy for oxygen ion diffusion that is less then the activation energy for oxygen ion diffusion of the first material. The alternating layers can provide portions where oxygen ions can diffuse more easily, e.g., the second and fourth portions 506-2, 506-4 that include the second material, and portions where oxygen ions are more likely to stay trapped within, e.g. the first and third portions 506-1, 506-3 that include the first material.

Figures 6, 7:
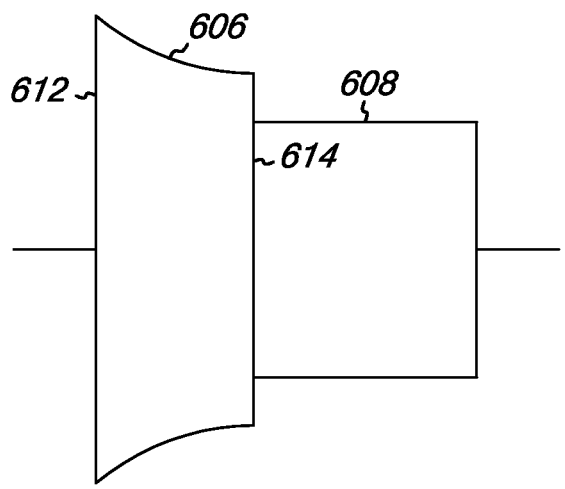
FIG. 6 is a graphical illustration of the energy band diagram for an oxide based memory cell formed in accordance with one or more embodiments of the present disclosure.
FIG. 7 is a table that illustrates the currents and current ratios in a prior art oxide based memory cell and an oxide based memory cell formed in accordance with one or more embodiments of the present disclosure when biased at 0.5 volts (V).

FIG. 6 is a graphical illustration of the energy band diagram for an oxide based memory cell formed in accordance with one or more embodiments of the present disclosure. FIG. 6 illustrates the energy band diagram for the tunnel barrier configuration shown in FIG. 3. In the embodiment of FIG. 6, the tunnel barrier includes a first material and a second in varying proportions from a first edge 612 to a second edge 614 of the tunnel barrier 606. The tunnel barrier 606 includes 100% of the first material, which has a higher activation energy for oxygen ion diffusion than the second material, at the first edge 612 and 100% of the second material, which as has a lower activation energy for oxygen ion diffusion than the first material, at the second edge 614 of the tunnel barrier 606. The tunnel barrier 606 has a decreasing amount of the first material and an increasing amount of the second material from the first edge 612 to the second edge 614 of the tunnel barrier, therefore the activation energy for oxygen ion diffusion decreases from the first edge 612 to the second edge 614 of the tunnel barrier 606, as indicated in FIG. 6.

The tunnel barrier 606 includes an activation energy for oxygen ion diffusion that gradually decreases from a first edge 612 of the tunnel barrier to the other. The curved slope of the tunnel barrier's activation energy for oxygen ion diffusion is caused by the proportion of the materials with differing conduction band energies forming the tunnel barrier gradually changing, with a greater proportion of the first material at a first edge 612 gradually changing to a greater proportion of the second material at the second edge 614. The higher the activation energy for oxygen ion diffusion at the first edge 612 of the tunnel barrier 606 indicates that a greater biasing voltage will be used to move oxygen ions from the oxygen source 608 to the first edge 612 of the tunnel barrier 606. This is because of the larger proportion of the first material at the first edge 612 of the tunnel barrier. A lower biasing voltage is used to move the oxygen ions from the oxygen source 608 to the second edge 614 of the tunnel barrier 606 with a larger proportion of lower activation energy for oxygen ion diffusion second oxide.

In one or more embodiments, the tunnel barrier 606 has an activation energy for oxygen ion diffusion of approximately 5 eV at the first edge 612 and an activation energy for oxygen ion diffusion of approximately 1 eV at the second edge 614. The differences in the activation energies of the first edge 612 and the second edge 614 of the tunnel barrier 606 can affect the biasing voltage used to move oxygen ions to the tunnel barrier and can also affect the ability of the tunnel barrier to retain the oxygen ions after the biasing voltage is removed from the memory cell.

FIG. 7 is a table that illustrates the currents and current ratios in a prior art oxide based memory cell 730 and an oxide based memory cell formed in accordance with one or more embodiments of the present disclosure 740 when biased at 0.5 volts (V). In FIG. 7, a memory cell according to the prior art 730 and a memory cell in accordance with one or more embodiments of the present disclosure 740 has a potential of 0.5 V applied across the cell. The table in FIG. 7 illustrates the current in the tunnel barrier in nanoamps (nA) for various levels of oxygen charge 720 ($Q_{ox}/cm^2$) in the tunnel barrier.

As shown in FIG. 7, a prior art tunnel barrier that includes hafnium oxide or zirconium oxide has 1.3 nA of current when biased at 0.5 V for an "off" state of a memory cell, e.g., an oxygen charge rich state. A tunnel barrier according to the present disclosure that includes an approximate thickness of 10 angstroms (Å) of aluminum oxide and 20 Å of hafnium oxide has a 0.87 nA of current when biased at 0.5 V for an "off" state. Also, a prior art tunnel barrier that includes hafnium oxide or zirconium oxide has 15 nA of current when biased at 0.5 volts (V) for an "on" state of a memory cell, e.g., an oxygen charge depleted state. A tunnel barrier according to the present disclosure that includes an approximate thickness of 10 angstroms (Å) of aluminum oxide and 20 Å of hafnium oxide has 14.4 nA of current when biased at 0.5 V for an "on" state. Thus the resulting current on/off ratio for the prior art memory cell having a tunnel barrier of hafnium oxide or zirconium oxide is 11.5 and the current on/off ratio for the memory cell of the current disclosure having a tunnel barrier of aluminum oxide and hafnium oxide is 16.6. Therefore, the memory cell according the present disclosure results in a higher current ratio allowing for the memory cell to more easily switch between the "off" and "on" states, to have a greater difference between the "on" and "off" states, and to better retain the oxygen ions in the tunnel barrier while using less current than the prior art memory cell.

Also, in the FIG. 7, the read current for the cells where the oxygen charge is 0 and oxygen ions are not transferred between the oxygen source and the tunnel barrier is less for the memory cell according the present disclosure than for the prior art memory cell. The read current for the prior art memory cell is 4.2 nA and the read current for the memory cell with 10 angstroms (Å) of aluminum oxide and 20 Å of hafnium oxide is 3.23 nA when the cells are biased at 0.5 V.

Methods, devices, and systems associated with oxide based memory are described herein. In one or more embodiments, a method of forming an oxide based memory cell includes forming a first electrode, forming a tunnel barrier, wherein a first portion of the tunnel barrier includes a first material and a second portion of the tunnel barrier includes a second material, forming an oxygen source, and forming a second electrode.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cell, comprising:
   forming a first electrode;
   forming a tunnel barrier over the first electrode, wherein the tunnel barrier is a graded tunnel barrier that includes an aluminum oxide material and a different material, wherein the graded tunnel barrier is formed by diffusing the different material into the aluminum oxide material with a continually increasing proportion;
   forming an oxygen source over the tunnel barrier;
   forming a second electrode over the oxygen source; and
   applying a biasing voltage to the memory cell such that oxygen ions move to the aluminum oxide material and the different material from the oxygen source creating an oxygen ion gradient increasing from the oxygen source to the first electrode and wherein the oxygen ion gradient is based on an activation energy of the graded tunnel barrier.

2. The method of claim 1, wherein forming the tunnel barrier over the first electrode includes forming the graded tunnel barrier by depositing the aluminum oxide material over the first electrode and introducing the different material to the tunnel barrier in increasing proportion until the tunnel barrier is complete and the aluminum oxide material not present at an edge of the tunnel barrier opposite an edge of the tunnel barrier that interfaces with the first electrode.

3. The method of claim 1, wherein forming the tunnel barrier over the first electrode includes forming the graded tunnel barrier by doping the tunnel barrier with the different material.

4. The method of claim 1, wherein forming the tunnel barrier over the first electrode includes forming the graded tunnel barrier using chemical vapor deposition (CVD).

5. The method of claim 1, wherein forming the tunnel barrier over the first electrode includes forming the graded tunnel barrier using atomic layer deposition (ALD).

6. The method of claim 1, including forming the tunnel barrier using chemical vapor deposition (CVD).

7. The method of claim 1, including forming the tunnel barrier using atomic layer deposition (ALD).

8. A method of forming an oxide based memory cell, comprising:
   forming a first electrode;
   forming a tunnel barrier by depositing an aluminum oxide material and doping the aluminum oxide material of the tunnel barrier with a different material, wherein the aluminum oxide material has a first activation energy for oxygen ion diffusion and the different material has a second activation energy for oxygen ion diffusion, and wherein forming the tunnel barrier includes depositing the aluminum oxide material over the first electrode to have a composition starting as approximately 100% of the aluminum oxide material at the interface of the first electrode and the tunnel barrier and continually increasing proportion of the different material in the tunnel barrier throughout the tunnel barrier until the tunnel barrier includes approximately 100% of the different material at the interface of the tunnel barrier and an oxygen source;
   forming the oxygen source over the tunnel barrier;
   forming a second electrode over the oxygen source; and
   applying a biasing voltage to the memory cell such that oxygen ions move to the aluminum oxide material and the different material from the oxygen source creating an oxygen ion gradient increasing from the oxygen source to the first electrode and wherein the oxygen ion gradient is based on an activation energy of the graded tunnel barrier.

9. The method of claim 8, wherein the first activation energy for oxygen ion diffusion of the aluminum oxide material is greater than the second activation energy for oxygen ion diffusion of the different material.

10. The method of claim 8, wherein the different material is hafnium oxide.

11. The method of claim 8, wherein the different material is zirconium oxide.

12. A method of forming a memory cell, comprising:
    forming a first electrode;
    forming a tunnel barrier over the first electrode, wherein the tunnel barrier is a graded tunnel barrier that includes an aluminum oxide material and a different material, wherein the graded tunnel barrier is formed by diffusing the different material into the aluminum oxide material with a continually increasing proportion, and wherein forming the tunnel barrier over the first electrode includes forming the graded tunnel barrier by depositing the aluminum oxide material over the first electrode to have a composition starting as approximately 100% of the aluminum oxide material at an interface of the first electrode and the tunnel barrier and continually increasing proportion of the different material in the tunnel barrier throughout the tunnel barrier until the tunnel barrier includes approximately 100% of the different material at an interface of the tunnel barrier and an oxygen source;
    forming the oxygen source over the tunnel barrier;
    forming a second electrode over the oxygen source; and
    applying a biasing voltage to the memory cell such that oxygen ions move to the aluminum oxide material and the different material from the oxygen source creating an oxygen ion gradient increasing from the oxygen source to the first electrode and wherein the oxygen ion gradient is based on an activation energy of the graded tunnel barrier.

* * * * *